United States Patent [19]

Sano

[11] 4,069,461
[45] Jan. 17, 1978

[54] AMPLIFIER CIRCUIT HAVING TWO NEGATIVE FEEDBACK CIRCUITS

[75] Inventor: Jun Sano, Machida, Japan

[73] Assignee: Tokyo Shibaura Electric Co., Ltd., Kanawaga, Japan

[21] Appl. No.: 777,359

[22] Filed: Mar. 14, 1977

[30] Foreign Application Priority Data

Mar. 19, 1976 Japan .................................. 51-29296

[51] Int. Cl.² .............................................. H03F 3/45
[52] U.S. Cl. ..................................... 330/260; 330/51; 330/103; 330/282
[58] Field of Search ................... 330/28, 30 D, 51, 103

[56] References Cited
U.S. PATENT DOCUMENTS 3,781,697 12/1973 Bruinshorst et al. ............... 330/51 X Primary Examiner—Lawrence J. Dahl
Attorney, Agent, or Firm—Oblon, Fisher, Spivak, McClelland & Maier

[57] ABSTRACT

The input stage of an amplifier circuit formed from first and second semiconductor differential amplifiers comprising a pair of transistors having emitter electrodes connected to each other, respectively. The respective collector electrodes of one pair of transistors in each of the first and second semiconductor differential amplifiers is connected to the respective collector electrodes of the other pair of transistors, the base electrode of one transistor of each pair of transistors respectively being connected to an input terminal of the amplifier circuit and the base electrode of the other transistor of each pair of transistors respectively being connected to first and second negative feedback circuits connected to the output stage of the amplification circuit. First and second electrical switches are respectively connected to the common emitter electrodes of each pair of transistors. One of the first and second electrical switches is controlled to be closed selectively.

4 Claims, 3 Drawing Figures

AMPLIFIER CIRCUIT HAVING TWO NEGATIVE FEEDBACK CIRCUITS

BACKGROUND OF THE INVENTION

1. Field of the Invention:

This invention relates generally to an amplifier circuit having two negative feedback circuits of different negative feedback ratios, for example, which can be employed as a pre-amplifier for an audio or video magnetic tape recorder requiring different gains for recording and reproduction, and more particularly to such an amplifier circuit which can be constructed as a semiconductor integrated circuit.

2. Description of the Prior Art:

FIG. 1 shows a prior art amplifier circuit having two negative feedback circuits of different negative feedback ratios, for example, which is employed as a pre-amplifier for an audio magnetic tape recorder requiring two gains for recording and reproduction. In the amplifier circuit shown in FIG. 1, a semiconductor differential amplifier is formed from first and second NPN transistors 10, 20 having a base electrode 11, 21, an emitter electrode 12, 22, and a collector electrode 13, 23, respectively. The emitter electrodes 12, 22 of the two transistors 10, 20 are connected to each other. The common emitter electrodes 12, 22, are grounded through a common emitter current source 30. The collector electrode 13 of the first transistor 10 is connected to a positive voltage source $+V_1$ (not shown in FIG. 1). The collector electrode 23 of the second transistor 20 is connected to the positive voltage source $+V_1$ through a load resistor 40. The base electrode 11 of the first transistor 10 is connected to an input terminal 50 of the amplifier circuit. The base electrode 21 of the second transistor 20 is connected to the negative feedback circuit 80, to be discussed. The semiconductor differential amplifier described above is driven by an input signal applied to the input terminal 50 and the common emitter current source 30. The output voltage of the semiconductor differential amplifier corresponding to the input signal appears across the load resistor 40 and is applied to an amplifier 60 of the next stage. A portion of the output signal from an output terminal 70 of the amplifier 60, which is connected to an output terminal of the amplifier circuit, is fed back to the base electrode 21 of said second transistor 20 through the negative feedback circuit 80. The negative feedback circuit 80 has two feedback loops. One of the two feedback loops is the series connection circuit comprising a first resistor 81, a second resistor 82 and a first capacitor 83. The other of the two feedback loops is the series connection circuit comprising a third resistor 84, a parallel circuit of a fourth resistor 85 and a second capacitor 86, the second resistor 82 and the first capacitor 83. One terminal of the first capacitor 83 is grounded. One terminal of the first and third resistor 81, 84 are selectively connected to the output terminal 70 of the amplifier 60 during recording and reproduction of audio signals by an electrical switching means 90. The base electrode 21 of the second transistor 20 is connected to the connection point between the first resistor 81 (or the parallel circuit of the fourth resistor 85 and the second capacitor 86 and the second resistor 82 as is shown in FIG. 1.)

As the negative feedback circuit 80 comprises two feedback loops, the amplifier circuit described above can produce two different gains and two gains having different frequency characteristics. However, as the electrical switching means 90 is connected between the out terminal 70 of the amplifier 60 and the negative feedback circuit 80, the potential at the electrical switching means 90 relative to ground varies continuously due to the output signal at the output terminal 70 of the amplifier 60. Therefore, it is difficult to form the amplifier circuit, particularly the electrical switching means, from a semiconductor integrated circuit.

SUMMARY OF THE INVENTION

Accordingly, it is an object of this invention to provide a novel and improved amplifier circuit having two negative feedback circuits of different negative feedback ratios, for example, which can be employed as a pre-amplifier for an audio magnetic tape recorder.

Another object of this invention is to provide an amplifier circuit which can be formed from a semiconductor integrated circuit.

Briefly, these objects according to this invention are achieved by the following circuit construction. Namely, an input stage of an amplifier circuit is formed from first and second semiconductor differential amplifiers which respectively include a pair of transistors having their emitter electrodes connected to each other. The base electrode of one transistor of the pair of transistors in each semiconductor differential amplifier is respectively connected to an input terminal of the amplifier circuit. The base electrode of the other transistor of each pair of transistors is respectively connected to two negative feedback circuits which are connected in common to an output terminal of the amplifier circuit. Two electrical switching means are respectively connected between the common emitter electrodes of the pair of transistors in each semiconductor differential amplifier and ground. By one of the two electrical switching means being closed selectively at recording and reproduction of audio signals, the operations of the first and second semiconductor differential amplifiers are controlled to be driven selectively.

BRIEF DESCRIPTION OF THE DRAWINGS

A more complete appreciation of this invention and many of the attendant advantages thereof will be readily obtained as the same becomes better understood by reference to the following detailed description when considered in connection with the accompanying drawings, wherein.

DESCRIPTION OF THE PREFERRED EMBODIMENT

Figure 1:
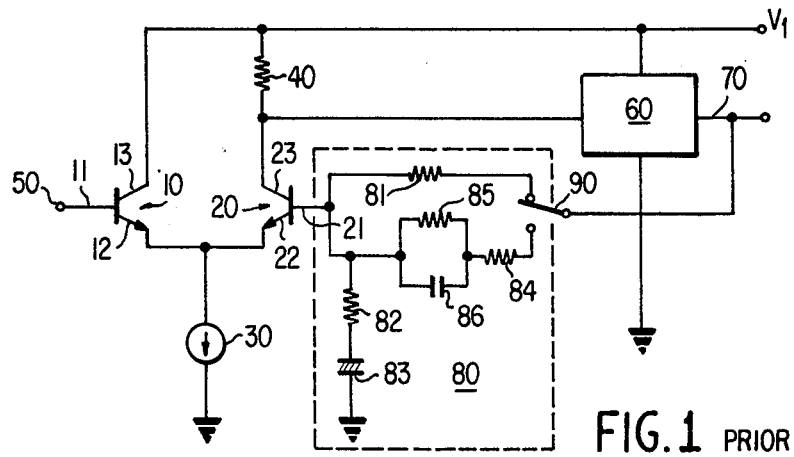
FIG. 1 is a circuit diagram showing the prior art.
Figure 2:
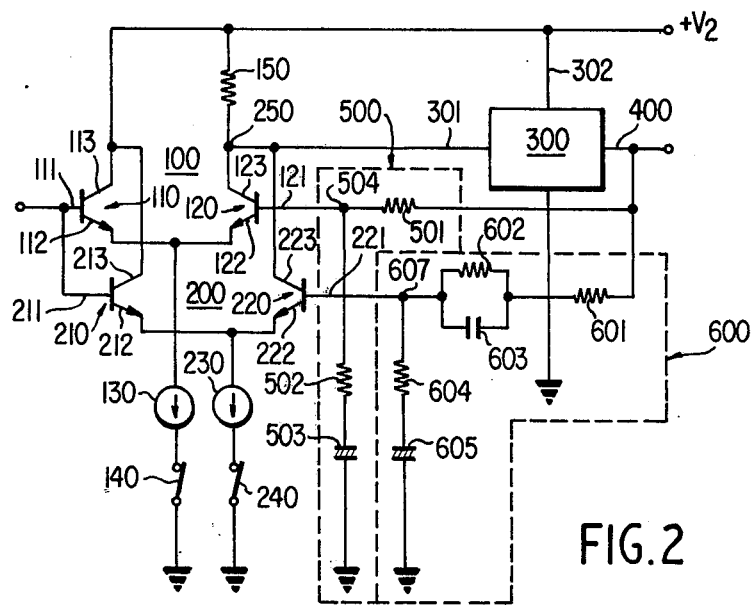
FIG. 2 is a circuit diagram showing one embodiment of this invention.

Referring now to the drawings, and more particularly to FIG. 2 thereof, there is shown a preferred embodiment of this invention which can be employed, for example, as a pre-amplifier circuit for an audio magnetic tape recorder. A first semiconductor differential amplifier 100, which is an input stage of the amplifier circuit, is formed from first and second NPN transistors 110, 120 having respectively a base electrode 111, 121, an emitter electrode 112, 122, and a collector electrode 113, 123. The emitter electrodes 112, 122 of the first and second transistors 110, 120, are connected to each other. The common emitter electrodes 112, 122, are connected to one terminal of a first common emitter current source 130. The other terminal of the first common emitter current source 130 is connected to one terminal of a first electrical switching means 140. The other terminal of the first electrical switching means 140 is grounded. The collector electrode 113 of said first transistor 110 is connected to a positive voltage source $+V_2$ (not shown in FIG. 2) through a direct current connection. The collector electrodes 123 of the second transistor 120 is connected to the positive voltage source $+V_2$ through a load resistor 150. A second semiconductor differential amplifier 200, which is also an input stage of the amplifier circuit, is formed by third and fourth NPN transistors 210, 220, having respectively a base electrode 211, 221, an emitter electrode 212, 222, and a collector electrode 213, 223. The emitter electrodes 212, 222, of the third and fourth transistors 210, 220 are connected to each other. The common emitter electrodes 212, 222, are connected to one terminal of a second common emitter current source 230. The other terminal of the second common emitter current source 230 is connected to one terminal of a second electrical switching means 240. The other terminal of the second electrical switching means 240 is grounded. The collector electrode 213 of the third transistor 210 is connected to the collector electrode 113 of the first transistor 110 and therefore to the positive voltage source $+V_2$ through the direct current connection. The collector electrode 223 of the fourth transistor 220 is connected to the collector electrode 123 of the second transistor 120 and therefore to the positive voltage source $+V_2$ through the load resistor 150.

The base electrode 211 of the third transistor 210 is connected to the base electrode 111 of the first transistor 110 and the common base electrodes 111, 211 are then connected to an input terminal of the amplifier circuit. The base electrode 121 of the second transistor 120 is connected to the first negative feedback circuit 500, to be discussed. The base electrode 221 of the fourth transistor 220 is connected to the second negative feedback circuit 600. The connection point 250 between the common collector electrodes 123, 223 of the second and fourth transistor 120, 220, and one terminal of the load resistor 150 is connected to an input terminal 301 of an amplifier 300 of the next stage. One terminal 302 of the amplifier 300 is connected to the positive voltage source $+V_2$ to supply the amplifier 300 with a reference potential.

An output terminal 400 of the amplifier 300 which is connected to an output terminal of the amplifier circuit of this invention, is connected to the first and second negative feedback circuits 500 and 600, respectively. The first negative feedback circuit 500 is formed by a series connection circuit of a first resistor 501, a second resistor 502 and a first capacitor 503. One terminal of the first resistor 501 is directly connected to the output terminal 400 of the amplifier 300. The connection point 504 between the other terminal of the first resistor 501 and one terminal of the second resistor 502 is connected to the base electrode 121 of the second transistor 120. One terminal of the first capacitor 503 is grounded. The second negative feedback circuit 600 is formed by a series connection circuit of a third resistor 601, a parallel connection circuit of a fourth resistor 602 and a second capacitor 603, a fifth resistor 604 and a third capacitor 605. One terminal of the third resistor 601 is connected directly to the output terminal 400 of the amplifier 300. The connection point 607 between one terminal of the parallel connection circuit of the fourth resistor 602 and the second capacitor 603 and one terminal of the fifth resistor 604 is connected to the base electrode 221 of the fourth transistor 220. One terminal of the third capacitor 605 is grounded. As the construction of said first negative feedback circuit 500 differs from that of the second negative feedback circuit 600, the negative feedback ratio of said first negative feedback circuit 500 is different from that of said second negative feedback circuit 600.

In the amplifier circuit described above, by means of one of two control signals, having opposite polarity potentials corresponding to recording and reproduction of audio signals respectively, provided by a control signal source (not shown in FIG. 2), one or the other of the first and second electrical switching means 140, 240 can be closed selectively. Corresponding to the above-mentioned operations of the first and second electrical switching means 140, 240, one of the above-mentioned first and second semiconductor differential amplifiers 100, 200 is driven selectively. An input signal applied to the input terminal 111 or 211 of the amplifier circuit is amplified by the first or second differential amplifier 100, 200. The voltage variation appearing across the load resistor 150 corresponding to the input signal is applied to the amplifier 300. A portion of the output signal at the output terminal 400 of the amplifier 300, which also is connected to an output terminal of said amplifier circuit, is applied to the first and second negative feedback circuits 500, 600 continuously. Therefore, the gains of the first and second semiconductor differential amplifiers 100, 200, are controlled by the first and second negative feedback circuits 500, 600, connected to the output terminal 400 of the amplifier 300.

In the amplifier circuit, as operations of the first and second electrical switching circuits 140, 240 are not influenced by the output signals at the output terminal 400 of the amplifier 300 and the other terminals thereof are grounded, the first and second electrical switching means 140, 240 can be replaced by semiconductor switching means comprising a semiconductor integrated circuit having a plurality of transistors.

Figure 3:
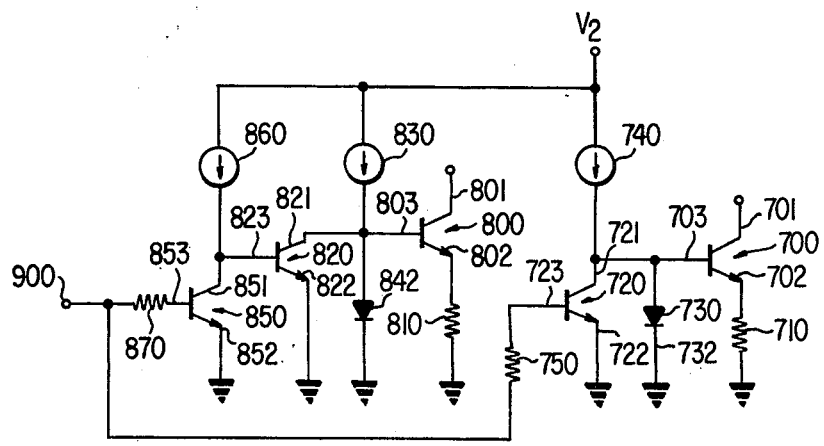
FIG. 3 is a detailed circuit diagram showing a semiconductor switching means in one embodiment of this invention shown in FIG. 2.

One embodiment of the first and second electrical switching means 140, 240, formed from a semiconductor integrated circuit, is shown in FIG. 3.

In this embodiment, the first and second common emitter current sources 130, 230, shown in FIG. 2 can be omitted. The collector electrode 701 of a fifth NPN transistor 700 is connected to the common emitter electrodes 112, 122 of the first and second transistors 110, 120. The emitter electrode 702 is connected to ground through a sixth resistor 710. The base electrode 703 is connected to the collector electrode 721 of a sixth NPN transistor 720. A first diode 730 is also connected between the base electrode 703 of the fifth transistor 700 and ground, an anode electrode 731 being connected to the base electrode 703 of the fifth transistor 700 and a cathode electrode 732 being grounded. The connection point between the base electrode 703 of the fifth transistor 700 and the collector electrode 721 of the sixth transistor 720 is connected to the above-mentioned positive voltage source $+V_2$ through a first current source 740. The emitter electrode 722 of the sixth transistor 720 is directly grounded and the base electrode 723 is connected to an input terminal 900 for control signals through a seventh resistor 750. The control signals are fed from a control signal source (not shown in FIG. 3) and have opposite polarities corresponding to recording and reproduction of audio signals respectively. The collector electrode 801 of a seventh NPN transistor 800 is connected to the common emitter electrodes 212, 222 of third and fourth transistors 210, 220. The emitter electrode 802 is grounded through an eighth resistor 810 and the base electrode 803 is connected to the base electrode 821 of an eighth NPN transistor 820. Between the base electrode 803 and the positive voltage source $+V_2$, a second current source 830 is connected. Also between the base electrode 803 and ground, a second diode 840 is connected, an anode electrode 841 being connected to the base electrode 803 of the seventh transistor 800 and a cathode electrode 842 being connected to ground. The emitter electrode 822 of the eighth transistor 820 is directly grounded. Its base electrode 823 is connected to a collector electrode 851 of a ninth NPN transistor 850. A connection point between the base electrode 823 and the collector electrode 851 of the ninth transistor 850 is connected to the positive voltage $+V_2$ through a third current source 860. The emitter electrode 852 is directly grounded. The base electrode 853 is connected to the input terminal 900 for control signals through a ninth resistor 870.

The above-mentioned embodiment of the first and second electrical switching means 140, 240 operates as described hereinafter. Supposing, for example, for reproduction of audio signals, the first electrical switching means 140 is closed and the second electrical switching means 240 is opened, a first control signal having a positive potential, which is fed from the control signal source is respectively applied to the base electrode 723 of the sixth transistor 720 through the seventh resistor 750 and the base electrode 853 of the ninth transistor 850 through the ninth resistor 870. The first control signal drives the sixth and ninth transistors 720, 850 to the on state. The fifth transistor 700 is cut off in response to the operation of the sixth transistor 720. Therefore, the first semiconductor switching means 140 is open. The eighth transistor 820 is cut off in response to the operation of the ninth transistor 850. The seventh transistor 800 is driven to the on state in response to the operation of the seventh transistor 800 and operates as a current source. Therefore, the second electrical switching means 140 is opened. Conversely, supposing for recording of audio signals the first electrical switching means 140 is closed and the second electrical switched means 240 is opened, when a second control signal fed from the control signal source, which has the opposite polarity to that of the first control signal, is applied to the input terminal 900. In response to the second control signal, all of the transistors 720, 700, 850, 820, 800 are driven conversely to the above-mentioned operation. Therefore, the first electrical switching means 140 is closed. The second electrical means 240 is opened and the fifth transistor 720 operates as a current source.

As explained above, the amplifier circuit of this invention has two negative feedback circuits with different negative feedback ratios. Therefore, the amplifier circuit can produce two different gains and two gains of different frequency characteristics. Further, the amplifier circuit of this invention can be conveniently formed from a semiconductor integrated circuit, as the electrical switching means of the amplifier circuit can be replaced by a semiconductor switching means comprising a semiconductor integrated circuit. Furthermore, the amplifier circuit of this invention can be employed, for example, as the pre-amplifier for an audio or video magnetic tape recorder, which must have two different gains and two different frequency characteristics of gains for recording and reproduction.

Obviously, numerous (additional) modifications and variations of the present invention are possible in light of the above teachings. For example, in the above-mentioned embodiment of the amplifier circuit and the electrical switching means thereof shown in FIGS. 2 and 3, it is apparent that PNP transistors may be replaced with NPN transistors. It is therefore to be understood that within the scope of the appended claims, the invention may be practiced otherwise than as specifically described herein.

What is claimed as new and desired to be secured by Letters Patent of the United States is:

1. An amplifier circuit having two negative feedback circuits of different negative feedback ratios comprising:
   an amplifier circuit input terminal;
   an amplifier circuit output terminal;
   a first semiconductor differential amplifier including first and second transistors, having base, emitter and collector electrodes respectively, the emitter electrodes of the first and second transistors being connected to each other, and the base electrode of said first transistor being connected to said amplifier circuit input terminal; a load resistor; and means for connecting said load resistor between the collector electrode of the second transistor and a reference potential source;
   a second semiconductor differential amplifier including third and fourth transistors, having base, emitter and collector electrodes respectively, the emitter electrodes of said third and fourth transistors being connected to each other, the collector electrode of said third transistor being connected to the collector electrode of said first transistor, the collector electrode of said fourth transistor being connected to the connection point between the collector electrode of said second transistor and said load resistor, the base electrode of said third transistor being connected to the base electrode of said first transistor;
   an amplifier having an input terminal connected to the connection point between the collector electrode of said second transistor and said load resistor, and an output terminal connected to said amplifier circuit output terminal;
   a first negative feedback circuit connected between the output terminal of said amplifier and the base electrode of said second transistor;
   a second negative feedback circuit connected between the output terminal of said amplifier and the base electrode of said fourth transistor;
   first switching means;
   means for connecting said first switching means between the common emitter electrodes of said first and second transistors and a reference potential source;
   second switching means; and
   means for connecting said second switching means between the common emitter electrodes of said third and fourth transistors and a reference potential source.

2. The amplifier circuit according to claim 1, wherein said first and second switching means comprise:
   a fifth transistor having its collector electrode connected to the common emitter electrodes of said first and second transistors; means for connecting the emitter electrode of the fifth transistor to a reference potential source; a sixth transistor having its collector electrode connected to the base electrode of said fifth transistor and its base electrode connected to said control means;

a seventh transistor having its collector electrode connected to the common emitter electrodes of said third and fourth transistors; means for connecting the emitter electrode of the seventh transistor to a reference potential source; an eighth tansistor having its collector electrode connected to the base electrode of said seventh transistor; and a ninth transistor having its collector electrode connected to the base electrode of said eighth transistor and its base electrode connected to said control means.

3. The amplifier circuit according to claim 2, wherein said first and second switching means comprise a semiconductor integrated circuit.

4. The amplifier circuit according to claim 2, wherein said first and second semiconductor differential amplifiers, said amplifier, said first and second negative feedback circuits and said first and second switching means comprise a semiconductor integrated circuit.

* * * * *